(12) United States Patent
Huard

(10) Patent No.: US 8,022,741 B2
(45) Date of Patent: Sep. 20, 2011

(54) DIGITAL ELECTRONIC DEVICE AND METHOD OF ALTERING CLOCK DELAYS IN A DIGITAL ELECTRONIC DEVICE

(75) Inventor: Vincent Huard, Le Versoud (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/526,503

(22) PCT Filed: Jan. 31, 2008

(86) PCT No.: PCT/IB2008/050368
§ 371 (c)(1),
(2), (4) Date: May 25, 2010

(87) PCT Pub. No.: WO2008/096303
PCT Pub. Date: Aug. 14, 2008

(65) Prior Publication Data
US 2010/0231276 A1    Sep. 16, 2010

(30) Foreign Application Priority Data
Feb. 9, 2007    (EP) ...................... 07290162

(51) Int. Cl.
*H03L 7/00*    (2006.01)
(52) U.S. Cl. .......................... 327/161; 327/141; 327/144
(58) Field of Classification Search .................. 327/161, 327/144
See application file for complete search history.

(56) References Cited

U.S. PATENT DOCUMENTS
| | | | |
|---|---|---|---|
| 6,028,816 A * | 2/2000 | Takemae et al. ........... | 365/233.1 |
| 6,260,154 B1 | 7/2001 | Jeddeloh | |
| 6,349,387 B1 | 2/2002 | Blomgren et al. | |
| 2004/0124892 A1 | 7/2004 | Diorio et al. | |
| 2005/0168255 A1 | 8/2005 | Gauthier et al. | |

FOREIGN PATENT DOCUMENTS
| | | | |
|---|---|---|---|
| EP | 1246388 A | | 10/2002 |
| EP | 1246388 A2 | * | 10/2002 |
| WO | 99/17183 A1 | | 4/1999 |

OTHER PUBLICATIONS

Ernst, Dan; "Razor: A Low-Power Pipeline Based on Circuit-Level Timing Speculation"; 36 Annual International Symposium on Microarchitecture (Micro-36); Dec. 2003; pp. 1-9.

* cited by examiner

*Primary Examiner* — Lincoln Donovan
*Assistant Examiner* — Ryan Jager

(57) ABSTRACT

A digital electronic device is provided with a first and second sequential logic unit (SS1, SS2), each for receiving an input signal (D) and for outputting a first and second output signal (Q, QF), respectively. The electronic device furthermore comprises a comparator unit (C) for comparing the first and second output signals (Q, QF) and an adaptive clock generator unit (ACG) for generating a first and second internal clock (CK, CKF) for the first and second sequential logic unit (SS1, SS2), respectively. In a self-tuning mode, the adaptive clock generator unit (ACG) is adapted to delay the first and second internal clock signals (CK, CKF) with respect to the other internal clock signal (CKF). The delay induced by the adaptive control generator unit (ACG) is dependent on the result of the comparison unit (C). In a normal operation mode the adaptive control generator unit (ACG) is adapted to maintain the delay between the first and second internal clock signals constant.

9 Claims, 2 Drawing Sheets

DIGITAL ELECTRONIC DEVICE AND METHOD OF ALTERING CLOCK DELAYS IN A DIGITAL ELECTRONIC DEVICE

FIELD OF THE INVENTION

The present invention relates to a digital electronic device and method of altering clock delays in a digital electronic device.

BACKGROUND OF THE INVENTION

Modern digital electronic devices often comprise a plurality of MOSFET. With the downscaling of the dimensions of the new transistors, negative bias temperature instability NBTI and hot carrier injection HCI degradations are becoming more important with respect to a long term reliability. It has become clear within recent years that degradation induced by NBTI and HCI will be present in most of the novel electronic devices. While NBTI is relevant for pMOSFETs, HCI is more relevant for nMOSFETs. The actual result of such a degradation will be a slowing down of the speed of digital circuitry. On the other hand, the threshold voltage and the saturated drain current may shift due to these degradations.

Although these degradations can be predicted e.g. by means of wafer-level reliability tests with a single isolated device during a process qualification phase, the detection and diagnosing of the aging effects of NBTI and HCI on VLSI circuitry is difficult, the operation of the circuits is not to be influenced. Furthermore, such a detection and diagnosis will require extra circuit blocks and therefore more circuit area.

Due to a typical slowing down of any degradated digital circuitry, the relative timing of data and clock signals may be altered and may cause timing violations. One way to avoid these timing violations is to increase the timing margins for the data and clock signals. However, such an increase of the timing margins will lead to a reduction of the chip performance in particular if pipelined circuits with speed critical parts are used. In addition, typically the optimal timing margin and the clock latencies are determined for given operating conditions and cannot be adjusted after the fabrication of the chips.

SUMMARY OF THE INVENTION

It is therefore an object of the invention to provide a digital electronic device with an on-chip compensation for the altering of clock delays due to NBTI and HCI degradations without having to change timing margins.

This object is achieved by a digital electronic device according to claim 1 and a method of compensating an a altering of clock delays according to claim 5.

Therefore, a digital electronic device is provided with a first and second sequential logic unit, each for receiving an input signal and for outputting a first and second output signal, respectively. The electronic device furthermore comprises a comparator unit for comparing the first and second output signals and an adaptive clock generator unit for generating a first and second internal clock for the first and second sequential logic unit, respectively. In a self-tuning mode, the adaptive clock generator unit is adapted to delay the first and second internal clock signals with respect to the other internal clock signal. The delay induced by the adaptive control generator unit is dependent on the result of the comparison unit. In a normal operation mode the adaptive control generator unit is adapted to maintain the delay between the first and second internal clock signals constant. According to an aspect of the invention, the output of the slowest sequential logic unit is used as the output of the electronic device. According to a further aspect of the invention, the electronic device comprises synchronous logic.

According to a preferred aspect of the invention, the self tuning mode is activated after a number of clock cycles or in case of changes in operating conditions of the electronic device.

The invention also relates to a method for altering clock delays in a digital electronic device. An input signal is received by a first and second sequential logic unit and a first and second output signal is output respectively. The first and second output signals are compared and a first and second internal clock is generated for the first and second sequential logic unit respectively. In a self-tuning mode, the delay is adapted to the first and second internal clock signals with respect to the other internal clock signal. This delay is dependent on the result of the comparison. In a normal operating mode, the delay between the first and second internal clock signals are maintained constant.

The invention relates to the idea that VLSI devices typically comprise synchronous logic, i.e. a data transfer is controlled by means of at least one clock signal. These clock signals are used by latches, flip-flop registers or the like to temporarily store data within a clock period. The clock frequency of the electronic devices is often maximized (i.e. the timing margin is reduced) in order to achieve a good system performance, while the electronic devices or chips may comprise several thousands to hundred thousands of latches. For example, if a register is to be implemented, a series connection of flip-flops can be used. In a scan mode, these flip-flops may be directly connected to other flip-flops such that the data signals as well as the clock signals are awaited at the subsequent unit. At the beginning of a design of an electronic device, timing margins are set such that the desired operation is possible. However, if circuits degradate, the timing margins may not be sufficient to ensure a desired operation of the device.

The embodiments and advantages of the present application will now be described in more detail with reference to the drawings.

DETAILED DESCRIPTION OF EMBODIMENTS

Figure 1:
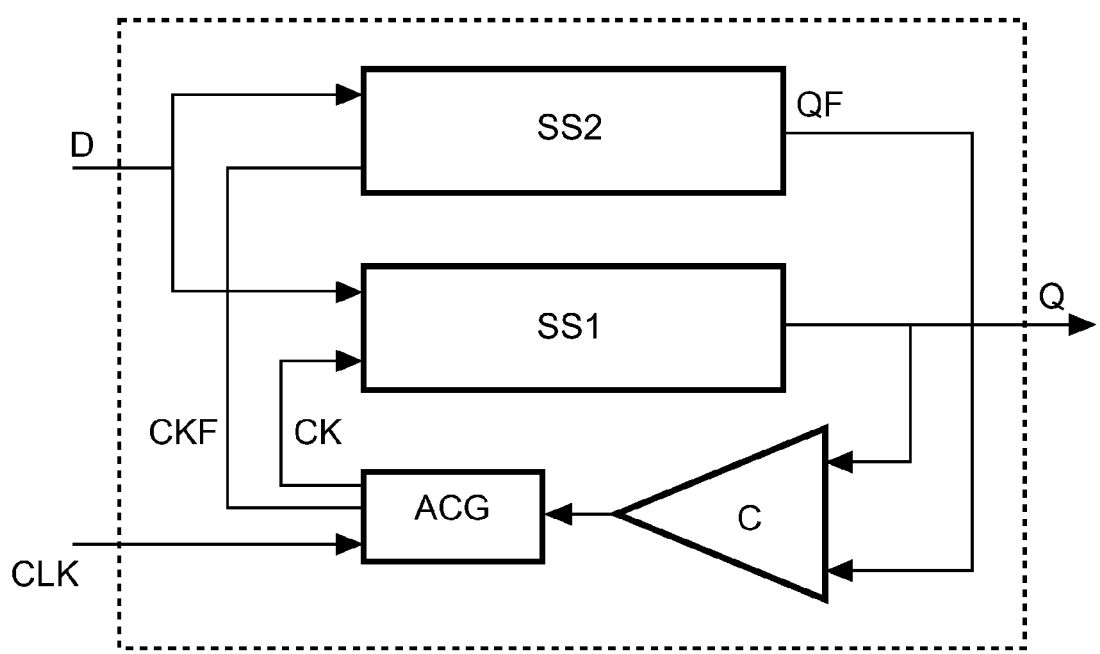
FIG. 1 shows a block diagram of an electronic device according to a first embodiment.

FIG. 1 shows a block diagram of an electronic device according to a first embodiment. The electronic device comprises a first and second sequential logic unit SS1, SS2, a comparator C coupled to the first and second sequential logic unit SS1, SS2 and an adaptive clock generator unit ACG which is coupled to the output of the comparator C. The two outputs CK, CKF of the adaptive clock generator unit ACG are received by the first and second sequential logic unit SS1, SS2 and serve as internal clock signals, respectively. The electronic device has an input D, an output Q as well as a clock input CLK. The adaptive clock generator unit ACG serves to vary the delay between the input clock CLK and the first and second internal clocks CK, CFK. The delay between the first and second internal clocks CK, CFK is preferably adjusted such that a correct data capture can be achieved at the output Q. The adaptive clock generator unit ACG is based on a principle of I/O devices with a floating gate or a so-called synapse transistor. The principles of the floating gate I/O device or the synapse transistor are described in detail by C. Dioro et al., "Floating-gate MOS synapse transistors", Kluwer Academic Publishers 1998, which is incorporated herein by reference. The digital electronic device according to FIG. 1 implements a modified flip-flop circuit. This flip-flop circuit has a normal mode of operation and a self-tuning mode of operation. According to the normal mode, the flip-flops operate as sequential elements, i.e. SS1, SS2 without any performance penalty. As no performance penalty is present, the modified flip-flops according to the first embodiment may replace sequential elements in a circuit netlist. Furthermore, these modified flip-flops can be included in automated flows and will require only two global programming signals.

However, according to the self-tuning mode, the clock delays of the modified flip-flop SS1, SS2 can be adapted to any input arrival time. Preferably, after a number of clock cycles (e.g. after a few billion clock cycles) or in the case that any operation condition changes, a self-tuning operation is initiated such that the electronic device will perform the self-tuning within a few clock cycles. The delays of the flip-flops are adapted by monitoring the outputs of the flip-flops and by comparing the outputs with a predetermined value which may correspond to an expected value. By means of the self-tuning mode of operation, an efficient way to compensate for delay changes can be achieved.

As the adaptive clock generator unit ACG is embodied on the chip, no off-chip computation and storage of optimal value are required. Accordingly, the actual system level answer is monitored instead of monitoring any shifts within individual transistors in the electronic device. The answer on the system level corresponds to the introduction of the delay time.

Figure 2:
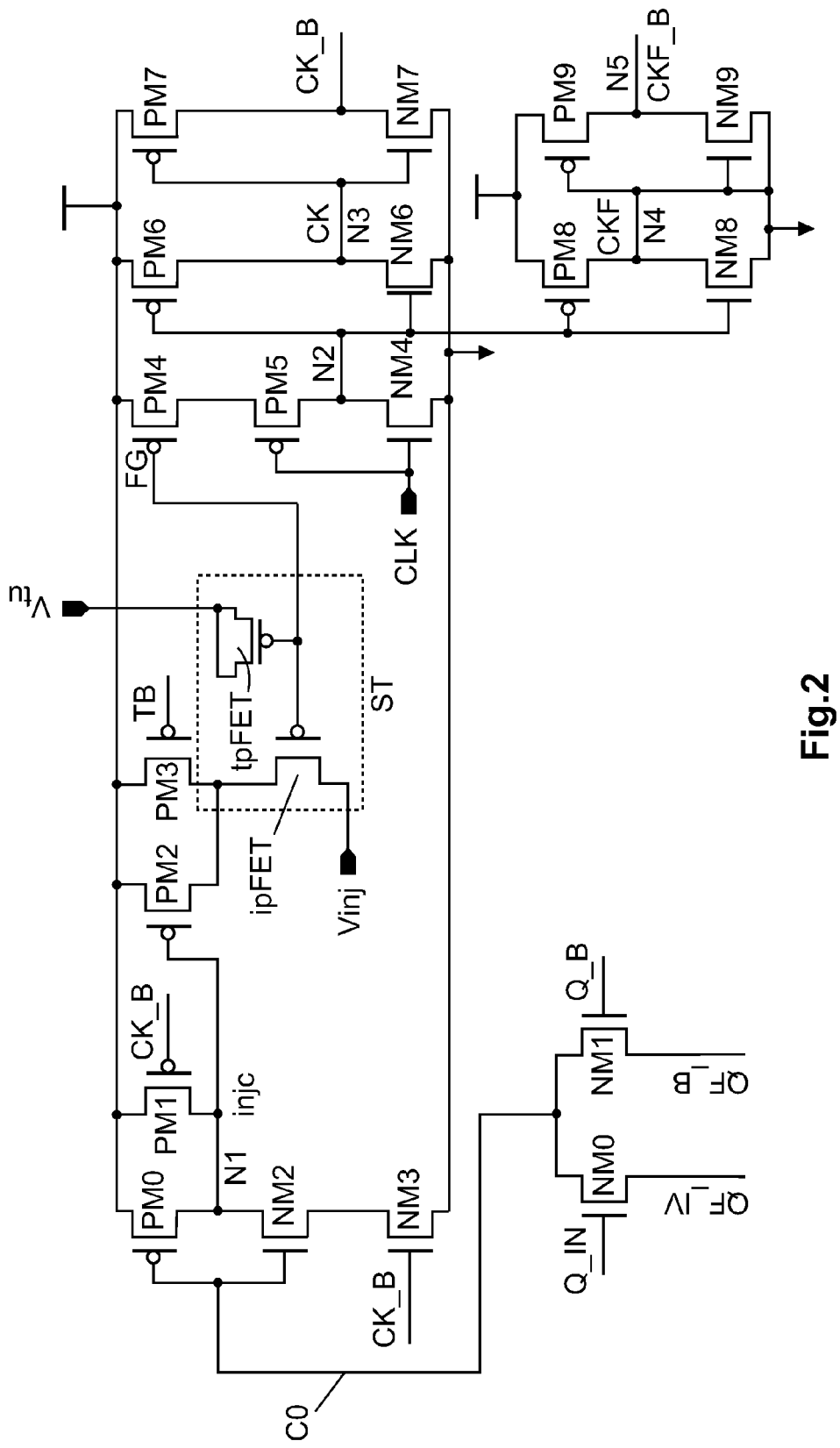
FIG. 2 shows a circuit diagram of the electronic device according to the first embodiment.

FIG. 2 shows a circuit diagram of an electronic device according to the first embodiment. In particular, the adaptive clock generator unit ACG and the comparator C are depicted in more detail. The comparator C comprises a first and second NMOS transistor NM0, NM1 and receives the output Q of the first sequential unit SS1 (as well as the complement thereof) and the output QF of the second sequential unit SS2 (as well as its complement). The output CO of the comparator C is coupled to the adaptive clock generator unit ACG. In other words, the rest of the circuit diagram in FIG. 2 corresponds to the adaptive clock generator unit ACG. The adaptive clock generator unit ACG will therefore have the output CO of the comparator C as well as the input clock signal CLK as inputs.

The output of the adaptive clock generator unit ACG corresponds to the first and second internal clocks CF, CKF as well as their complements. E.g., at a negative edge of the input clock signal CLK, the second internal clock CFK will switch first such that the first or second sequential unit SS1, SS2 will sample the input, wherein one sequential unit will sample the input of a failure margin before the other sequential unit. In particular, the second sequential unit SS2 will sample the input and output the output signal QF. The first sequential unit SS1 will also sample the input signal but it will sample the input a failure margin after the second sequential unit SS2 outputting the output signal Q.

In the comparator C, the output signals QF and Q as well as their complements are compared. Therefore, the comparator C comprises a first and second NMOS transistor NM0, NM1, wherein the output signal QF is coupled to the source of the first NMOS transistor NM0 while the output signal Q is coupled to the base of the first NMOS transistor NM0. The complements of the output signals QF and Q, i.e. QF_B, Q_B are coupled to the second NMOS transistor NM1 accordingly.

A first PMOS transistor PM0, a third NMOS transistor NM2 and a third NMOS transistor NM3 are coupled in series between ground and the supply voltage Vdd. The output of the comparator C0 is coupled to the gates of the first PMOS transistor PM0 and the third NMOS transistor NM2. The gate of the fourth NMOS transistor NM3 is coupled to the complement of the clock signal CK_B. The drain and source of a second PMOS transistor PM1 are coupled to the drain and the source of the first PMOS transistor PM0, respectively, while the gate is coupled to the clock signal CK_B. The sources of the transistor PM0 and the transistor PM1 are coupled to a first node N1. The gate of a third PMOS transistor PM2 is coupled to the first node N1, while its drain is coupled to the drains of the first and second PMOS transistors PM0, PM1, i.e. to Vdd. The source of the third PMOS transistor PM2 is coupled to a synapse transistor ST. The drains of the first, second and third PMOS transistors PM0, PM1, and PM2 are coupled to ground. The same applies to the drain of a fourth PMOS transistor PM3. The source of this fourth PMOS transistor PM3 is coupled to the synapse transistor ST while its gate is coupled to a signal for testing TB. The synapse transistor ST receives a voltage $V_{tu}$ as input and outputs a signal FG. A fifth and sixth PMOS transistor PM4, PM5 and a fifth NMOS transistor NM4 are coupled in series between ground and supply voltage Vdd, wherein a second node N2 is coupled between the sixth PMOS transistor PM5 and the fifth NMOS transistor. The fifth PMOS transistor PM4 receives the signal FG at its gate while the gates of the PMOS transistor PM5 and the gate of the fifth NMOS transistor NM4 are coupled to the clock input CLK. A seventh PMOS transistor PM6 is coupled in series with a seventh NMOS transistor NM6 between ground and the supply voltage Vdd, wherein a third node N3 is coupled between the seventh PMOS transistor and the sixth PMOS transistor. The gate of the seventh PMOS transistor PM6 and the gate of the seventh NMOS transistor NM6 are coupled to a second node N2. An eighth PMOS transistor PM7 is coupled in series via a third node N3 with an eighth NMOS transistor NM7 between ground and the supply voltage Vdd, wherein the gates thereof are coupled to the second node N2. The source of the eighth PMOS transistor PM7 and the drain of the eighth NMOS transistor NM7 are coupled to the complement of the clock signal CK, i.e. they are coupled to CK_B.

A ninth PMOS transistor PM8 is coupled in series via a fourth node N4 with a ninth NMOS transistor NM8 between ground and the supply voltage Vdd, while their gates are coupled to the second node N2. A tenth PMOS transistor PM9 is coupled in series with a tenth NMOS transistor NM9, while its gates are coupled to Vdd and the source of the ninth PMOS transistor PM8. The node between the source of the tenth PMOS transistor PM9 and the drain of the tenth NMOS transistor NM9 corresponds to the signal CKF_B.

If the signals QF and Q match as determined by the comparator C, the third PMOS transistor PM2 is turned on such that current flows through the injector pFET ipFET, If the circuit is set to the normal operation, the voltage Vinj is set to the supply voltage Vdd. In this case, no current can flow through the injector pFET such that the delay induced by the adaptive clock generator unit ACG is constant.

However, if the circuit is switched to the self-tuning mode as described above, the voltage Vinj is set to a negative voltage. Therefore, an electron injection will occur in the floating gate of the synapse transistor ST and the delay induced by the adaptive clock generator ACG is reduced. The delay induced by the adaptive clock generator ACG is reduced repeatedly for every clock cycle until the input signal is not correctly sampled by the output signal QF of the second sequential unit SS2. In other words, a mismatch will occur between the output signal Q and the output signal QF as detected by the comparator C such that the third NMOS transistor PM2 is turned off and the operation of the adaptive clock generator ACG is turned off, i.e. the reduction of the delay is turned off. Preferably, the injection voltage is selected such that each delay step within a clock cycle is smaller than the failure margin of the flip flops.

The transistor NM6, PM6, NM8 and PM8 are selected such that the signal CKF will lead the signal CK by a failure margin which corresponds to the delay.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

Furthermore, any reference signs in the claims shall not be constrained as limiting the scope of the claims.

The invention claimed is:

1. A digital electronic device, comprising:
a first sequential logic unit and a second sequential logic unit for receiving an input signal and for outputting a first output signal and a second output signal, respectively,
a comparator unit for comparing the first and second output signals, wherein the comparator unit comprises a first NMOS transistor and a second NMOS transistor, wherein the first and second NMOS transistors are configured to receive the first and second output signals and complements of the first and second output signals, and
an adaptive clock generator unit for generating a first internal clock signal and a second internal clock signal for the first and second sequential logic units based on a first clock signal, respectively,
wherein in a self-tuning mode the adaptive clock generator unit is configured to delay the first or second internal clock signal with respect to the second or first internal clock signal,
wherein the delay induced by the adaptive clock generator unit is dependent on the result of the comparator unit, and
wherein in a normal operation mode the adaptive clock generator unit is configured to maintain the delay between the first and second internal clock signals constant.

2. The digital electronic device of claim 1, wherein the first sequential logic unit samples the input signal a failure margin after the second sequential logic unit, and wherein the output of the first sequential logic unit is used as an output of the digital electronic device.

3. The digital electronic device of claim 1, wherein the digital electronic device comprises synchronous logic.

4. The digital electronic device of claim 1, wherein the self-tuning mode is activated after a number of clock cycles or in case of changes in operating conditions of the digital electronic device.

5. The digital electronic device of claim 1, wherein the second output signal is coupled to a source of the first NMOS transistor while the first output signal is coupled to a base of the first NMOS transistor.

6. The digital electronic device of claim 1, wherein a complement of the second output signal is coupled to a source of the second NMOS transistor while a complement of the first output signal is coupled to a base of the second NMOS transistor.

7. The digital electronic device of claim 1, wherein the first and second NMOS transistors are configured to compare the first and second output signals and to compare the complements of the first and second output signals.

8. A method for altering clock delays in a digital electronic device, comprising:
receiving an input signal by a first sequential logic unit and a second sequential logic unit and outputting a first output signal and a second output signal,
comparing the first and second output signals using a first NMOS transistor and a second NMOS transistor comprising receiving the first and second output signals and complements of the first and second output signals using the first and second NMOS transistors, and
generating a first internal clock signal and a second internal clock signal for the first and second sequential logic units based on a first clock signal, respectively,
wherein in a self tuning mode, the first or second internal clock signal is delayed with respect to the second or first clock signal,
wherein the induced delay is dependent on the result of the comparison, and
wherein in a normal operation mode the delay between the first and second internal clock signals is maintained constant.

9. An integrated circuit, comprising:
a first sequential logic unit and a second sequential logic unit for receiving an input signal and for outputting a first output signal and a second output signal based on a first clock signal respectively,
a comparator unit for comparing the first and second output signals, wherein the comparator unit comprises a first NMOS transistor and a second NMOS transistor, wherein the first and second NMOS transistors are configured to receive the first and second output signals and complements of the first and second output signals, and
an adaptive clock generator unit for generating a first internal clock signal and a second internal clock signal for the first and second sequential logic units, respectively,
wherein in a self-tuning mode the adaptive clock generator unit is configured to delay the first or second internal clock signal with respect to the second or first internal clock signal,
wherein the delay induced by the adaptive clock generator unit is dependent on the result of the comparator unit, and
wherein in a normal operation mode the adaptive clock generator unit is configured to maintain the delay between the first and second internal clock signals constant.

* * * * *